United States Patent [19]

Agrawal et al.

[11] Patent Number: 5,153,462
[45] Date of Patent: Oct. 6, 1992

[54] PROGRAMMABLE LOGIC DEVICE INCORPORATING VOLTAGE COMPARATOR

[75] Inventors: Om P. Agrawal, San Jose, Calif.;
Michael J. Wright, Boulder, Colo.;
Steve Sidman, Vancouver, Wash.

[73] Assignee: Advanced Micro Devices, Inc., Sunnyvale, Calif.

[21] Appl. No.: 703,455

[22] Filed: May 21, 1991

[51] Int. Cl.[5] .................................... H03K 19/177
[52] U.S. Cl. ...................... 307/465; 307/494; 364/600
[58] Field of Search ............... 364/600–602, 364/716; 307/465–469, 202.1, 243, 480, 490, 494, 290

[56] References Cited

U.S. PATENT DOCUMENTS

| | | | |
|---|---|---|---|
| 4,190,898 | 2/1980 | Farnsworth et al. | 364/601 |
| 4,213,174 | 7/1980 | Morley et al. | 364/601 |
| 4,499,549 | 2/1985 | Bartlett | 364/602 X |
| 4,758,746 | 7/1988 | Birkner et al. | 364/716 X |
| 4,878,200 | 10/1989 | Asghar et al. | 365/189.08 X |
| 4,958,520 | 9/1990 | Trommler et al. | 364/558 X |
| 4,963,768 | 10/1990 | Agrawal et al. | 307/465 |
| 4,972,517 | 11/1990 | Kondou et al. | 307/494 X |
| 5,027,315 | 6/1991 | Agrawal et al. | 307/465 X |

*Primary Examiner*—David Hudspeth
*Attorney, Agent, or Firm*—Fliesler, Dubb, Meyer & Lovejoy

[57] ABSTRACT

A single integrated circuit including programmable logic having a plurality of inputs and a plurality of outputs, with at least one input of the programmable logic coupled to an on-chip analog comparator is provided. In one aspect of the invention, a voltage comparator having programmable hysteresis for setting the output state switching thresholds of the comparator is utilized. In another aspect of the invention, the programmable logic comprises a programmable combinatorial array having a programmable AND array and a fixed OR array. The integrated circuit further comprises an output block including a plurality of flip-flops and output buffers coupled to at least one I/O pin for selectively determining the state of the I/O pin. In yet another aspect the invention, the programmable combinatorial array includes a plurality of AND array outputs, divided into three subsets, for input to three pairs of OR gates which comprise the fixed OR plane of the device.

56 Claims, 4 Drawing Sheets

PROGRAMMABLE LOGIC DEVICE INCORPORATING VOLTAGE COMPARATOR

BACKGROUND OF THE INVENTION

1. Field of the Invention

The invention relates generally to programmable logic devices, and more particularly to a programmable logic device having on-chip analog functional capabilities.

2. Description of the Related Art

Programmable logic devices (PLD), including the programmable array logic (PAL) device and the programmable gate array, are integrated circuits which can be configured by the user to perform logic functions on digital inputs. PLDs offer digital designers a flexible and cost-effective implementation for complex logic circuits and the best alternative amongst a spectrum of products ranging from fully customized integrated circuits to standard, dedicated-purpose devices.

A typical PAL includes a programmable array of AND gates, and a fixed array of OR gates. In other programmable logic devices, both the AND and the OR arrays are programmable. The outputs of such combinatorial logic arrays used in programmable logic circuits may be coupled directly to an I/O pin, or input to clockable registers. In many devices, the combinatorial logic array outputs are registered and are fed back to the inputs of the combinatorial array. Some programmable logic circuits also include a clockable input synchronizing register located between an input pin and one of the inputs to the combinatorial array. PAL is a trademark of Advanced Micro Devices, Inc. See, Advanced Micro Devices, Inc. PAL ® Device Handbook, (1988).

The programmable logic device has thus given the digital designer a means for reducing circuit size through higher integration, ease of design and documentation by software specification, and the security of keeping the design proprietary.

It is desirable to provide a device which allows a user the ability to perform programmable output functions on variable amplitude inputs. Part of the reason for the lag in development between the analog and digital worlds is that designers typically try to accomplish analog functions by performing an analog-to-digital conversion at the earliest possible point in the data signal path to implement the solution in the digital realm, while performing a digital-to-analog conversion as the final step before outputting the signal.

A single integrated circuit having both analog and digital functional components working together to accomplish a programmable function possesses great flexibility and programmability by allowing programmable digital solutions to be derived from analog inputs.

One relatively simple programmable/analog type device is the X9MME E²POT Digitally Controlled Potentiometer by Xicor Corporation, Milpitas, California, which provides a 99-increment resistor ladder controlled by a digitally decoded counter, providing a variable resistance load based on the count value. The device includes the capacity to store a count value in non-volatile memory on power down.

SUMMARY OF THE INVENTION

The invention comprises a single integrated circuit including programmable logic having a plurality of inputs and a plurality of outputs, with at least one input of the programmable logic coupled to an on-chip analog comparator.

One aspect of the invention utilizes a voltage comparator having programmable hysteresis for setting the output state switching thresholds of the comparator.

In another aspect of the invention, the programmable logic comprises a programmable combinatorial array having a programmable AND array and a fixed OR array. The integrated circuit further comprises an output block including a plurality of flip-flops and output buffers coupled to at least one I/O pin for selectively determining the state of the I/O pin.

In yet another aspect the invention, the programmable combinatorial array includes a plurality of AND array outputs, divided into three subsets, for input to three pairs of OR gates which comprise the fixed OR plane of the device.

BRIEF DESCRIPTION OF THE DRAWINGS

The invention will be described with respect to the particular embodiments thereof. Other objects, features and advantages of the invention will become apparent with reference to the specification and drawings in which.

FIG. is a chip-level block diagram of the integrated circuit of the present invention.

DETAILED DESCRIPTION OF THE INVENTION

The invention will be described herein with reference to the preferred embodiments, however, it should be understood that numerous variations and modifications will be understood by those skilled in the art as within the context of the invention.

Figure 1:
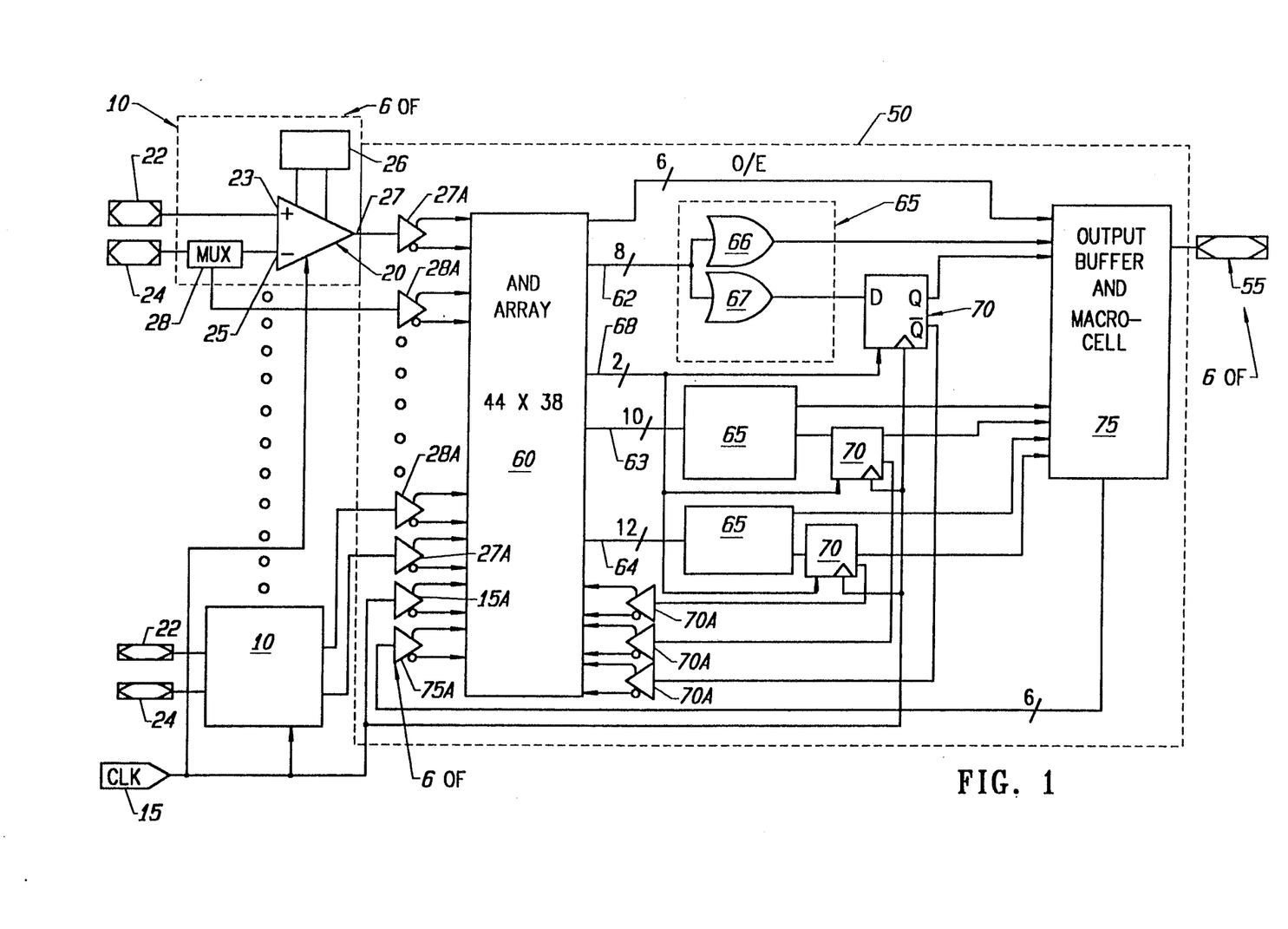

The integrated circuit shown in FIG. 1 includes six analog functional elements 10 providing inputs to a programmable combinatorial array 50. The programmable combinatorial array 50 includes a programmable AND array 60 which provides output terms (62, 63, 64) to an output logic array comprising three pairs of OR gates 65. The output logic array provides registered and combinatorial outputs to six device output pins 55 via an output buffer 75. The analog functional elements 10, in combination with the programmable logic circuitry, combinatorial array 50 and output logic 65, 75, provide a device which combines analog device functionality with the programmability and usefulness of digital logic on a single chip. Specifically, the programmable logic device of the present invention combines the functions of a programmable array logic device (PAL) with the functions of a comparator to produce a versatile device for use in both analog and analog-to-digital interface applications.

In one aspect of the invention, each comparator 20 includes internally programmable hysteresis. These voltage comparators are useful in zero cross detection, frequency doubling, voltage controlled oscillators, line driving and receiving operations, and magnetic pickup detection. These functions are combined on a single integrated circuit device with the programmability and versatility of a PAL capable of performing digital functions from analog inputs, thereby yielding single analog-to-digital input comparisons, digital function outputs from zero cross detections, and analog-to-digital conversions.

Each analog functional element 10 includes programmable voltage comparator 20, test voltage $V_{i(+)}$ (non-inverting) input pin 22 coupled to a non-inverting comparator input 23, and reference voltage $V_{i(-)}$ (inverting) input pin 24, coupled via multiplexer 25 to inverting comparator input 25. Analog comparator 20 includes an output 27 which provides a logic state signal input to programmable combinatorial array 50. Specifically, output 27 is coupled to input buffer 27a which provides the logic state signal on output 27 and its compliment to programmable AND array 50.

Analog comparator 20 is coupled to programmable hysteresis circuit 26 which programs output 27 of comparator 20 to exhibit a hysteresis effect with respect to a test voltage applied to non-inverting input 23. Programmable hysteresis circuit 26 allows the chip user to program a hysteresis function into comparator 20. The programmable hysteresis function sets the switching thresholds of comparator 20 such that a high/low output voltage transition occurs when the test input voltage $V_{i(+)}$ is at a first amplitude and low/high output voltage logic state transition occurs when test input voltage $V_{i(+)}$ is at a second amplitude. FIG. depicts programmable hysteresis circuit 26 as an on-chip circuit as part of analog functional element 10. However, it is within contemplation of the invention to provide programmable hysteresis circuit 26 as an off-chip element. The practical applications and preferred embodiments for implementing programmable hysteresis circuit 26 are discussed in further detail below with respect to FIGS. 2–6.

Multiplexer 28 allows inverting input pin 24 to be configured in two distinct ways. In one alternative, input pin 24 comprises the normal inverting input 25 to the comparator 20. In another alternative, inverting input pin 24 is coupled to input buffer 28a and acts as a direct digital input, providing a logic state signal and its inverse to the programmable combinatorial array 50. In the digital array input mode, the inverting input voltage $V_{i(-)}$ is set to an internal reference value midway between analog element supply voltages $V_{s(+)}$ and $V_{s(-)}$. Further, when inverting input pin 24 is in the digital array input mode, non-inverting input pin 22 can be configured as either an analog or digital input, depending upon the application. In either case, inverting input voltage $V_{i(-)}$ is a fixed reference. Still further, in the case where non-inverting input pin 22 is configured as a digital input, if hysteresis is programmed into comparator 20 (as discussed below), non-inverting input 22 will act as a conventional Schmitt-trigger input to combinatorial array 50.

As noted above, programmable combinatorial array 50 comprises programmable AND array 60, fixed input OR array comprising three pairs of OR gates 65, an output block comprised of a number of D-type flip-flops 70, and programmable output buffer/macrocell 75.

Programmable AND array 60 includes 44 input terms comprising 22 signal inputs and their complements. The 22 input signals comprise six analog element 10 outputs, one clock/strobe input 15, six reference voltage inputs from multiplexer 28, three inputs from registers 70, and six inputs from output buffer/macrocell 75.

The product term outputs of AND array 60 are configured to comprise inputs to the fixed input OR plane (62, 63, 64), act as SET/RESET triggers 68 for flip flops 70, and act as output enable (O/E) signals to output buffer/macrocell 75.

The product term outputs configured as inputs to the fixed OR array are grouped into three sets 62, 63, 64, corresponding to three pairs 65 of OR gates 66, 67 comprising the fixed OR plane. Each OR gate pair 65 shares either first product term set 62, second product term set 63, or third product term set 64 comprised of eight, ten, or twelve product term outputs, respectively.

The output of OR gate 66 is combinatorial and the output of OR gate 67 is registered. In one configuration, when one of the product terms in the first 62, second 63, or third 64 product term set is programmed to give a function to either OR gate 66 or 67, that particular product term cannot be programmed to provide a functional output from the other OR gate in a particular OR gate pair 65. While it is technically possible to drive both inputs, this orientation provides a faster configuration for the PLD. This use of product term sharing allows the distribution of product terms to be better organized thereby yielding less overall redundancy. The same functionality in conventional PAL architecture would require an array twice the size, because each output would require its own set of product terms. Further, pairing of combinatorial (OR gate) 66 and registered (OR gate) 67 outputs using product term sharing allows up to three analog functional elements 10 to be programmed as individual, combinatorial voltage comparators with the use of an input strobe signal on clock input line 15. In such an arrangement, each OR gate output uses one product term, leaving the remaining shared terms for the registered output. This gives the device the versatility to perform integrated analog/digital solutions, and mix analog and digital solutions in applications with the availability of individual comparators.

Clock input line 15 couples a clock/strobe signal to programmable voltage comparator 20, programmable AND array 60 (via input buffer 15a), and programmable output buffer 75. The signal on clock input line 15 allows the device programmer to latch the output state of comparator 20. This feature is useful when the programmable logic device is to be used as a sample-and-hold circuit, where clock input line 15 is linked to the switches of the sampling circuit. Clock input 15 also supplies a clock signal to the edge-triggered D-type flip-flops (output registers) 70 of array 50.

One problem associated with the use of an analog voltage comparator in the device is a resulting increased load to the programmable logic device's analog supply voltage ($V_s$) resulting from changes in the voltage level of output 27. The increased load can alter reference voltage $V_{i(-)}$, thereby causing oscillation of the comparator's output signal and incongruous inputs to the programmable AND array 60.

The input signal on clock input line 15 can be used to maintain the stability of the programmable logic device during high-speed operation. If the enable time of the signal is shorter than the total signal propagation delay through the differential input stage 35 of voltage comparator 20, (see FIG. 2 and accompanying description), then the input to the differential stage 35 will be "frozen" before any voltage change in the output of programmable logic device occurs as a result of the comparison.

The programmable hysteresis function of the comparator, discussed below with reference to FIGS. 2-6 is another method of overcoming input signal oscillations, but the effect of the positive feedback used therein can cause time penalties at high speed.

Also shown in FIG. 1, are D-type flip-flop registers 70 are coupled to the outputs of OR gate 67, and include non-inverting Q and outputs. For each flip-flop 70, non-inverting output Q is coupled to output buffer 75 and inverting output Q is coupled via an input buffer 70a as an input to AND array 60. Two outputs of AND array 60 comprise PRESET and RESET signals via output lines 68 to flip-flops 70. The clock inputs of flip-flops 70 are also coupled to the clock input line 15 as discussed above.

Programmable output buffer/macrocell 75 allows the user to selectively provide the OR array outputs to six device pins 55. Typically, output buffer/macrocell 75 includes a plurality of multiplexers to selectively couple each device pin 55 to a plurality of input buffers 75a allowing pins 55 to be used as direct inputs to AND array 60. As is shown in FIG. 1, the combinatorial output of OR gate 66 and the registered output of OR gate 67 (via register 70) are coupled to output buffer 75. Six product term outputs of AND array 60 comprise output enable signals (OE) input to output buffer/macrocell 75. Output buffer/macrocell 75 thereby allows device pins 55 to be used as outputs from, or as inputs to, the programmable logic device. During the programming state, the user selects the output drive required for the particular application of the programmable logic device. Output buffer/macrocell 75 has the capability of dedicating each OR array output as an open collector or a totem pole, although use as an open collector can be utilized only when each device pin 55 is defined as a dedicated output.

Figure 2:
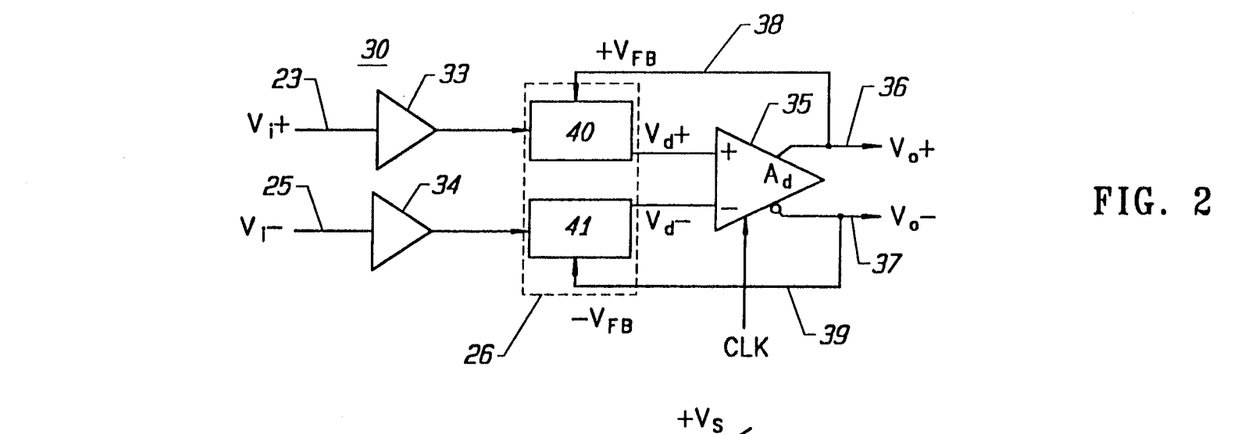
FIG. 2 is a block diagram of the preferred embodiment of the analog voltage comparator utilized in the present invention.

FIG. 2 is a block diagram showing programmable voltage comparator 30 which may be utilized as an alternative to programmable voltage comparator 20 and programmable hysteresis circuit 26 shown in FIG. 1. It should be noted that programmable voltage comparator 30 shown in FIG. 2 includes differential gain amplifier 35 25 which has both non-inverting output 36 and inverting output 37 for supplying non-inverting output voltage $V_{o(+)}$ and inverting output voltage $V_{o(-)}$, respectively. Thus, the need for input buffer 27a (shown in FIG. 1) is eliminated when programmable voltage comparator 30 is utilized in the programmable logic device.

Figure 5:
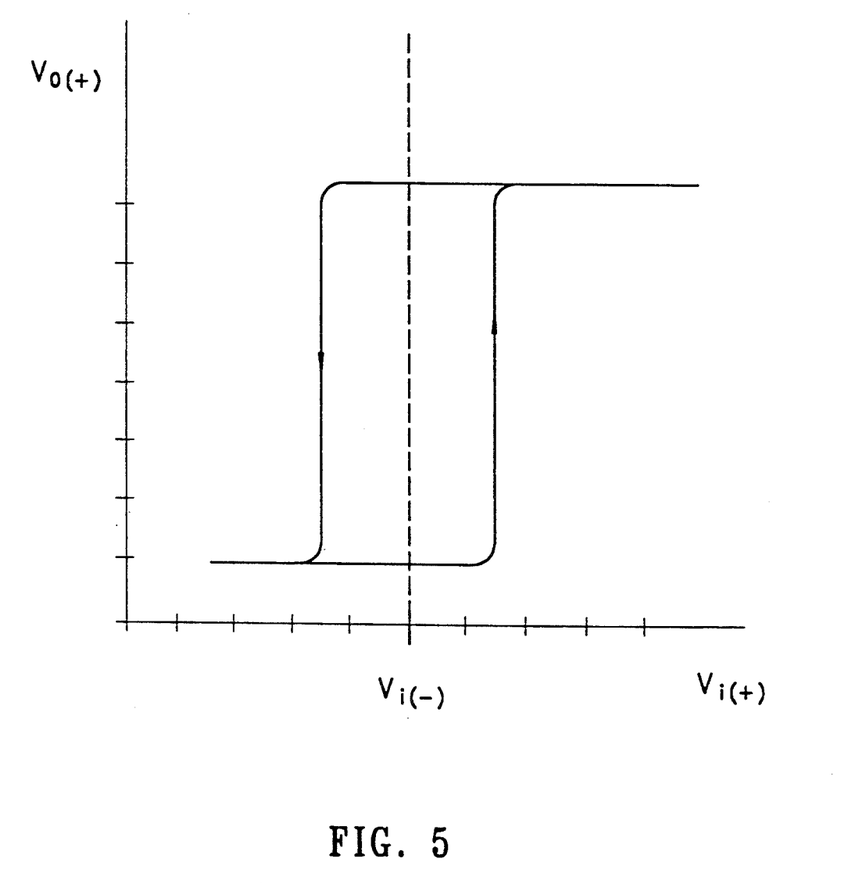
FIG. 5 is a graphic representation of the hysteresis effect of the output voltage $V_0$ versus the test input voltage $V_{i(+)}$ of the voltage comparator.

A typical analog voltage comparator outputs a first voltage level representing a logic level HIGH output when the voltage applied to its test (non-inverting) input exceeds the voltage applied to its reference (inverting) input, and a second voltage level representing a logic level LOW output when the test voltage is less than the reference voltage. Both programmable voltage comparators 20 (FIG. 1) and 30 (FIGS. 2 and 6) utilized in the device allow for user-programmable hysteresis to generate an output as shown in FIG. 5. FIG. 5 reflects the condition whereby the test voltage required to initiate a logic level LOW-to-HIGH transition on the comparator output is greater than the test voltage required to initiate a logic level HIGH-to-LOW transition.

Essentially, programmable hysteresis circuit 26, shown in FIG. 2, moves the true comparison reference voltage $V_{i(-)}$ of programmable voltage comparator 30 to a lower apparent level such that input test signal $V_{i(+)}$ must exceed both the true reference level and the apparent reference levels ($V_{i(-)}+V_H$) to produce an output change. For purposes of this specification, the difference between the true and the apparent input voltages is termed the hysteresis voltage $V_H$. The effect of hysteresis on the output voltage is shown in FIG. 5 which is a plot of output voltage $V_{o(+)}$ as a function of the non-inverting voltage $V_{i(+)}$.

As shown in FIG. 2, programmable voltage comparator 30 includes non-inverting voltage $V_{i(+)}$ input 23, and inverting voltage $V_{i(-)}$ input 25 for receiving a test voltage and a reference voltage, respectively. Non-inverting input 23 and inverting input 25 are coupled to input buffers 33 and 34. The output of each input buffer 33 and 34 is coupled to level shift circuits 40 and 41 which generate output voltages $V_{d(+)}$ and $V_{d(-)}$, respectively, proportional to input voltages $V_{i(+)}$ and $V_{i(-)}$. Level shift output voltages $V_d$ are input to differential gain stage amplifier 35.

Non-inverting output 36 of differential amplifier 35 is coupled by a feedback line 38 to logic shift circuit 40. Likewise, differential amplifier inverting output 37 is coupled by a feedback line 39 to level shift circuit 41. Feedback lines 38 and 39 supply feedback voltages $V_{fb(+)}$ and $V_{fb(-)}$ to level shift circuits 40 and 41, which cause level shift circuits 40 and 41 to vary output voltages $V_{d(+)}$ and $V_{d(-)}$ responsive to the state of the output voltages $V_{o(+)}$ and $V_{o(-)}$ of differential amplifier 35. As discussed in detail below, by varying the levels of $V_{d(+)}$ and $V_{d(-)}$, the desired hysteresis effect is achieved. Differential amplifier 35 also includes a clock signal input for receiving the signal on clock/strobe input line 15.

The switching of voltage comparator 30 of the present invention, and the effect of the level shift circuits 40 and 41 thereon, will be described herein with reference to FIGS. 3 and 4.

Figure 3A:
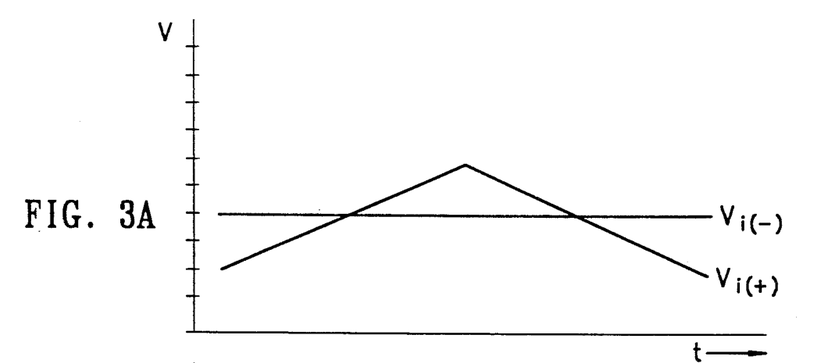
FIG. 3A is a graphic representation of the test (non-inverting) input voltage $V_{i(+)}$ and the reference (inverting) input voltage $V_{i(-)}$ versus time in a typical analog voltage comparator.
Figure 3B:
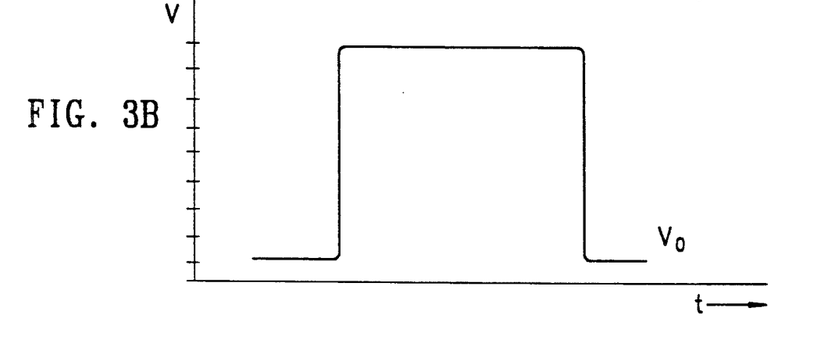
FIG. 3B is a graphic representation of the output voltage $V_0$ of a typical analog voltage comparator with reference to FIG. 3A and the test and reference voltages.

FIGS. 3A and 3B represent the input voltage and output voltage relationships for a typical comparator. FIG. 3A is a graph of input voltages $V_{i(+)}$ and $V_{i(-)}$ in relation to time. FIG. 3B shows the value of output voltage $V_o$ corresponding to the input voltage values shown in FIG. 3A. Comparing FIGS. 3A and 3B, one notes that output voltage $V_o$ is at a logic level LOW state ($-V_s$) at all points where test voltage $V_{i(+)}$ is less than reference voltage $V_{i(-)}$. Output voltage $V_o$ achieves a logic level HIGH state ($+V_s$) at all times when test voltage $V_{i(+)}$ exceeds reference voltage $V_{i(-)}$. As will be understood following the discussion below, FIGS. 3A and 3B also describe the situation wherein programmable fuses 43 are set such that inverting amplifier 42 (FIG. 6) is programmed such that the programmable hysteresis circuit 26 exhibits no effect on output voltages $V_{d(+)}$ and $V_{d(-)}$.

Figure 4A:
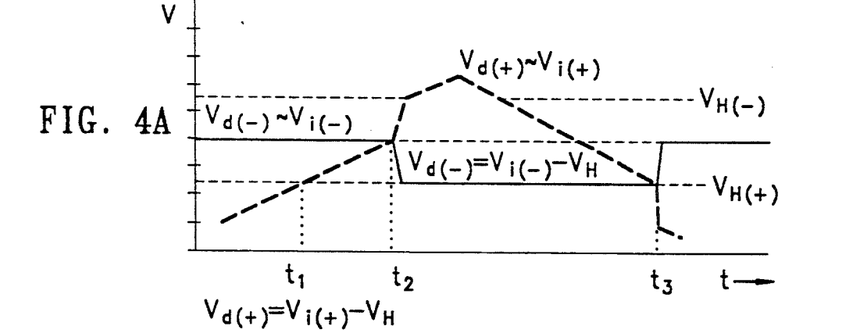
FIG. 4A is a graphic representation of the test (non-inverting) input voltage $V_{i(+)}$ and the reference (inverting) input voltage $V_{i(-)}$ versus time in the preferred embodiment of the analog voltage comparator utilized in the present invention.
Figure 4B:
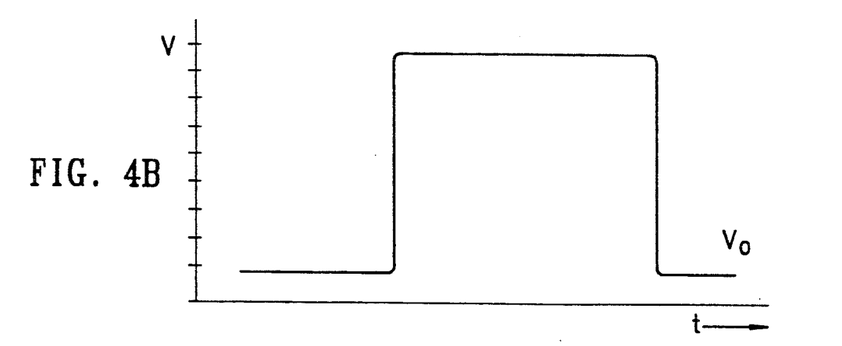
FIG. 4B is a graphic representation of the output voltage $V_0$ with reference to the input voltages of FIG. 3A for the preferred embodiment of the analog voltage comparator of the present invention.

FIGS. 4A and 4B graphically show the effect of level shift circuits 40 and 41 on output 27 of programmable voltage comparator 30 of the present invention. FIG. 4A is a graph of level shift circuit output voltages $V_{d(+)}$ and $V_{d(-)}$ versus time. FIG. 4B is a graph of comparator output voltage $V_{o(+)}$ corresponding to differential stage input voltages (and level shift output voltages) $V_{d(+)}$ and $V_{d(-)}$. FIGS. 4A and 4B are shown in relation to the switching states of a typical comparator based on input voltages $V_{i(+)}$ and $V_{i(-)}$ shown in FIG. 3A.

In the comparator waveforms shown in FIGS. 3A and 3B, output voltage $V_o$ changes at the point where $V_{i(+)}$ equals $V_{i(-)}$; in comparator 30, output state switching occurs when $V_{d(+)}$ equals $V_{d(-)}$. When no hysteresis is present, $V_{d(+)}$ and $V_{d(-)}$ will be proportional to $V_{i(+)}$ and $V_{i(-)}$, respectively. In the presence of hysteresis, level shift circuits 40 and 41 act as follows: when output voltage $V_{o(+)}$ is at a logic level HIGH state, inverted output $V_{o(-)}$ and $V_{FB(-)}$ are at a logic level LOW state and $V_{d(+)}$ remains at a level proportional to $V_{i(+)}$ while level shift circuit 41, responsive to $V_{FB(-)}$, decreases $V_{d(-)}$ a value of $V_H$; correspondingly, when output voltage $V_{o(+)}$ and $V_{FB(+)}$ are logic level LOW and the inverted output voltage $V_{o(-)}$ is logic level HIGH, level shift circuit 40, responsive to $V_{FB(+)}$ decreases $V_{d(+)}$ by a value of $V_H$.

With reference to FIG. 4A, at time $t_1$ output voltage $V_{o(+)}$ is at a logic level LOW and inverted output voltage $V_{o(-)}$ is a logic level HIGH. $V_{FB(+)}$ is also LOW causing $V_{d(+)}$ to be less than $V_{i(+)}$ by a value of $V_H$ $V_i(+)$;-$V_H$; correspondingly, reference $V_{d(-)}$ is proportional to $V_{i(-)}$. At time $t_2$, when an increasing $V_{d(+)}$ (corresponding to $V_{i(+)}$-$V_H$), equals $V_{d(-)}$, comparator output $V_{o(+)}$ changes from a logic level LOW state to a logic level HIGH state. This results in an increase in the amplitude of $V_{d(+)}$ and a decrease in the amplitude of $V_{d(-)}$, since feedback voltage $V_{fb(-)}$ causes level shift circuit 41 to decrease $V_{d(-)}$ by $V_H$ and $V_{d(+)}$ becomes proportional to $V_{i(+)}$. At time $t_3$, when a decreasing $V_{d(+)}$ equals $V_{d(-)}$ a second logic level shift occurs, $V_{o(+)}$ returns to a logic level LOW state and $V_{o(-)}$ to a logic level HIGH state, thus causing the amplitude of $V_{d(-)}$ to increase and the amplitude of $V_{d(+)}$ to decrease, by $V_H$.

It should be recognized by those skilled in the art that while the above discussion refers to a single hysteresis voltage $V_H$, separate amplitudes of $V_H$ can be provided for each level shift circuit 40, 41.

To examine the hysteresis process in a different context, consider the conditions of the waveforms in FIGS. 3 and 4. Initially, in FIG. 3 prior to time $t_1$:

$$V_{i(+)} < V_{i(-)}$$

$$V_{o(+)} = \text{"0"}$$

and $$V_{o(-)} = \text{"1"}$$

As shown in FIG. 4, the feedback of the "1" on $V_{o(-)}$ deactivates level shift circuit 41 on $V_{i(-)}$ and the feedback of the "0" on $V_{o(+)}$ activates level shift circuit 40 on $V_{i(+)}$ creating the conditions shown in FIG. 4A, prior to time $t_1$ where:

$$V_{d(-)} \alpha V_{i(-)}$$

and $$V_{d(+)} \alpha V_{i(+)} - V_H.$$

This effect means satisfying the condition $$V_{i(+)} = V_{i(-)} + V_H$$

to produce the condition for switching $V_{o(+)}$ from "0" to "1"; e.g.

$$V_{d(+)} = V_{d(-)}$$

for an output switch on $V_o$ from "0" to "1." When the switch condition occurs, the output $V_{o(+)}$ will change from "0" to "1" (at time $t_2$, FIG. 4A). As $V_{o(+)}$ becomes "1," the feedback $V_{o(+)}$ deactivates the level shift (41) on $V_{i(+)}$, and the feedback of the new "0" on $V_{o(-)}$ activates the level shift (40) on $V_{i(-)}$ creating the conditions $$V_{d(+)} \alpha V_{i(+)}$$

and $$V_{d(-)} \alpha V_{i(-)} - V_H.$$

In order to now produce a switch on $V_{o(+)}$ from "1" to "0" the input condition must be $$V_{i(+)} = V_{i(-)} - V_H$$

to gain the condition for output switching of $$V_{d(+)} = V_{d(-)}.$$

When the output $V_{o(+)}$ changes from "1" to "0" at time $t_3$, $V_{d(+)}$ reduces and $V_{d(-)}$ increases by the predetermined voltage $V_H$.

The aforementioned changes to level shift output voltages $V_{d(+)}$ and $V_{d(-)}$ result in the requirement that test voltage $V_{i(+)}$ be increased by the level of hysteresis voltage $V_H$ to produce the condition of output change wherein $V_{d(+)}$ equals $V_{d(-)}$. Thus, output voltage $V_o$ achieves the desired hysteresis effect with respect to input voltages $V_{i(+)}$ and $V_{i(-)}$ as shown in FIG. 5.

As discussed above, this programmable hysteresis effect is one method for reducing the effect of small oscillatory signals on slow-changing input signals from causing switching oscillations on the response of the voltage comparator at the input switching point.

The programmable hysteresis function described above may, when the on-chip comparators 20 are independently operated as simple comparators, be actuated by a positive feedback network external to the integrated circuit chip. However, comparator 30 with internal hysteresis is required when the array is not configured for independent comparator operation, such as in flash analog/digital and line receiving applications.

Figure 6:
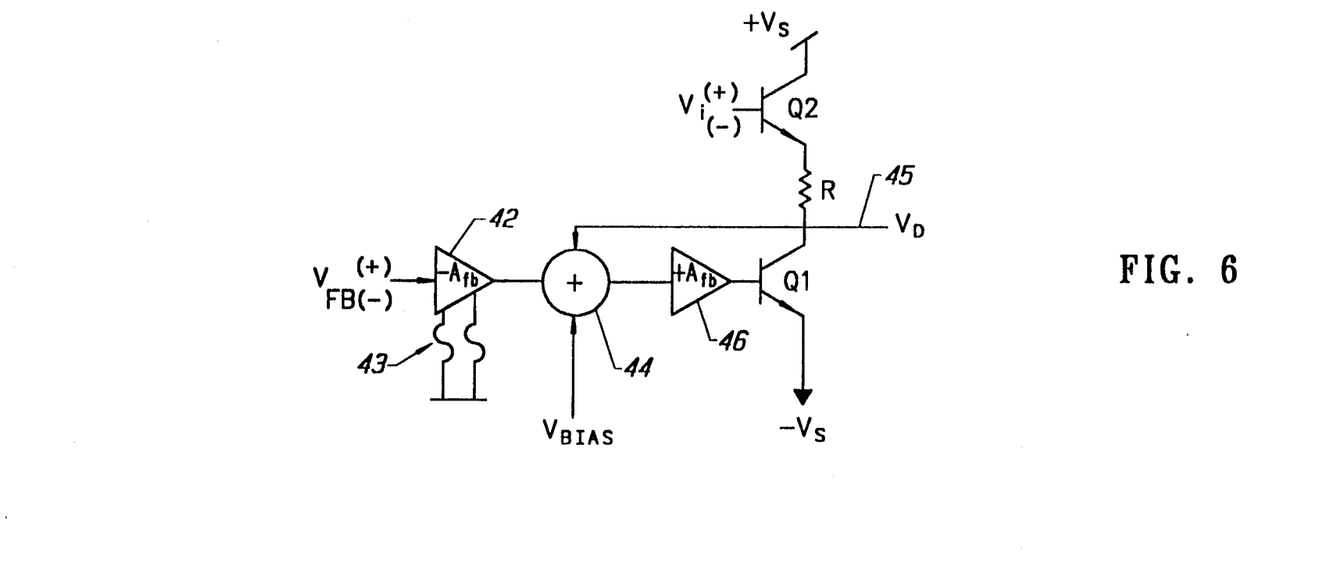
FIG. 6 is a schematic diagram of the logic shift circuitry utilized in the preferred embodiment of the analog comparator shown in FIG. 2.

The preferred embodiment of level shift circuits 40 and 41 is shown in FIG. 6. The circuit shown in FIG. 6 will produce the desired hysteresis effect shown in FIG. 5 when used on both non-inverting input 31 and inverting input 32.

As shown in FIG. 6, inverting and non-inverting feedback voltages $V_{fb(+)}$ and $V_{fb(-)}$ are input to an inverting amplifier 42 having a gain of $-A_{fb}$. Inverting amplifier 42 includes programmable fuses 43 which allow the user to selectively program gain $-A_{fb}$ of inverting amplifier 42. As discussed below, by programming the output gain of inverting amplifier 42, the amount of hysteresis on output voltage $V_o$ of the differential amplifier 35 can be selected by the user. The output of inverting amplifier 42 is provided to summing node 44. The summed voltage from summing node 44 is provided as an input to amplifier 46, having a gain of $+A_{fb}$, which provides an amplified output voltage coupled to the gate of transistor Q1. Either comparator input voltage, $V_{i(+)}$ or $V_{i(-)}$, is coupled to the base of second transistor Q2. Transistor Q2 has a collector coupled to the PLD's analog supply voltage $V_s$ and an emitter coupled to a resistor R. Resistor R is also coupled to the collector of transistor Q1, and the emitter of transistor Q1 is coupled to common $(-V_s)$. Resistor R and the collector of transistor Q1 are also coupled to summing node 44 and output 45. As shown in FIG. 2, output 45 and is bias voltage $V_{bias}$ are also coupled to summing node 44. In operation, if $V_{FB}$s is a logic HIGH state, the signal is provided through amplifiers 42 and 46 to the base of transistor Q1 and the voltage at $V_d$ is proportional to $V_1$. If $V_{FB}$ is a logic level LOW state, the voltage at the base of Q2, and consequently the current in the collector of Q2 will be higher than in the situation where $V_{FB}$ is HIGH. The programmer can select the value of $-A_{fb}$ for inverting amplifier 42 using fuse-programmable logic 43 and thereby adjust the current in the collector of Q2 and the value of $V_H$. By increasing the value of $-A_{fb}$ when $V_{fb}$="0", the collector current in transistor Q1 will increase, thus reducing the value of $V_d$ and hence implementing increasing $V_H$. If fuses 43 are selected to provide a zero effect from feedback voltage $V_{fb}$, then $V_{d(-)}\alpha V_{i(-)}$, $V_{d(+)}\alpha V_{i(+)}$ and no hysteresis will be present on the output of differential amplifier 35.

Although fuses 43 are shown as the means for programming inverting amplifier 42, it will be understood by those skilled in the art that alternatives to programmable fuses may be utilized as, for example, EPROM, EEPROM or Anti-fuse cells. Furthermore, although transistors Q1 and Q2 have been described with reference to bipolar technology, it will be understood by those skilled in the art that alternative types of transistors Q1 and Q2 may be utilized within the scope of the present invention as, for example, CMOS.

In the above discussion of FIG. 6, the level shift circuit provides $V_d\alpha V_1 - V_H$ when the $V_{fb}$ input is LOW. It should be recognized by those skilled in the art that level shift circuits 40 and 41 can be readily designed to be responsive to logic level HIGH output voltages to provide the $V_d$ output. In addition, it is within contemplation of the invention to provide $V_d$ outputs which increase the input voltages by $V_H$, e.g., $V_d\alpha V_i + V_H$.

The aforementioned programmable logic device results in a combination of the functions of a programmable array logic device (PAL) with the functions of a comparator to produce a versatile device for use in both analog and analog-to-digital interface applications. In the preferred embodiment of the invention, each comparator 20 utilizing internally programmable hysteresis is useful in zero cross detection, frequency doubling, voltage controlled oscillators, line driving and receiving operations, and magnetic pickup detection. These functions can be combined with the versatility and programmability of PALs to provide digital functional outputs from analog inputs; the device can provide single analog-to-digital input comparisons, functional outputs from zero cross detections, and analog-to-digital conversion to provide digital inputs for the PAL.

The invention has been described with respect to the particular embodiments thereof. Numerous variations are possible as will be apparent to a person of ordinary skill in the art after reading the present specification For example, though the invention has been particularly described with respect to bipolar technology, other types of semiconductor technology, such as CMOS, are equally applicable. Further, programmable hysteresis is described as enabled by fuse-programmable logic, other types of programming technology, such as EEPROMs are equally compatible. Still further, although the output blocks and a particular OR gate array structure have been particularly defined for the PAL architecture, numerous variations on the configuration of the OR array, the output blocks, and the particular method of product term sharing are possible and within the scope of the present invention. Furthermore, numerous sizes of AND gate arrays are within the contemplation of the invention as are any number of voltage comparator inputs. These variations and others are intended to be within the scope of the present invention as defined by the specification, claims and drawings.

What is claimed is:

1. A single integrated circuit, comprising:
   an analog comparator having an output means for providing an output signal;
   a programmable logic circuit having at least one logic circuit input and at least one logic circuit output; and
   means for coupling said output of said analog comparator to said one logic circuit input.

2. The integrated circuit of claim 1 wherein said analog comparator further includes first and second inputs for receiving first and second input voltages.

3. The integrated circuit of claim 2 wherein said programmable logic circuit includes at least a second logic circuit input and said integrated circuit further includes a multiplexer coupled to said second input for selectively coupling said second input voltage to said second programmable logic circuit input or said second input.

4. The integrated circuit of claim further including a means for receiving a clock signal, and wherein said analog comparator further includes clock signal input responsive to said clock signal for freezing the output state of said comparator.

5. The integrated circuit of claim 2 wherein said analog comparator includes
   a differential amplifier having a third input, a fourth input, a first output for providing a logic signal output, and a second output for providing the inverse of said logic signal output;
   programmable voltage shift circuitry coupled between said first and third voltage inputs and said second and fourth voltage inputs, respectively, and including feedback circuitry, coupled to said first and second outputs, for providing a third voltage to said third input responsive to said first output and a fourth voltage to said fourth input responsive to said second output.

6. The integrated circuit of claim 5 wherein said differential amplifier outputs a first logic signal to said first output when said first input voltage is greater-than said second input voltage plus a first offset voltage, and said differential amplifier outputs the inverse of said first logic signal to said first output when said first input voltage is less than said second input voltage minus said first offset voltage.

7. The integrated circuit of claim 5 wherein said differential amplifier outputs a first logic signal to said first output when said first input voltage is greater-than said second input voltage plus a first offset voltage, and said differential amplifier outputs the inverse of said first logic signal to said first output when said first input voltage is less than said second input voltage minus a second offset voltage.

8. The integrated circuit of claim 6 wherein said programmable voltage shift circuitry includes means for selecting the level of said offset voltage.

9. The integrated circuit of claim 8 wherein said means for selecting comprises fuse programmable logic.

10. The integrated circuit of claim 8 wherein said means for selecting comprises at least one electrically erasable programmable read-only memory (EEPROM) cell.

11. The integrated circuit of claim 6 wherein said programmable voltage shift circuitry includes a first level shift circuit, including
  a first amplifier having an input and output, said first amplifier comprising an inverting amplifier providing a signal to its output which is the logical inverse of the signal provided to its input, said input of said first amplifier being coupled to said first output, said first amplifier further including means for programming the gain of said first amplifier;
  a second amplifier having an input and an output;
  a summing means for summing a plurality of voltages, including a plurality of inputs, one of said plurality of inputs being coupled to said output of said first amplifier and another of said plurality of inputs being coupled to a bias voltage, said summing means further having an output coupled to said input of said second amplifier for providing a summed voltage to said second amplifier;
  first and second transistors each having a gate, source, and drain electrode, Wherein said gate of said first transistor is coupled to said output of said second amplifier, said gate of said second transistor is coupled to said first input, said source of said second transistor is coupled to a supply voltage;
  a resistor having one end coupled to said drain of said second transistor, and having a second end coupled to said source of said first transistor, and one of said summing means inputs; and
  means, coupled to said resistor means and said drain of said second transistor, for providing an output signal to said third input.

12. The integrated circuit of claim 6 wherein said programmable voltage shift circuitry includes a second level shift circuit, including
  a first amplifier having an input and output, said first amplifier comprising an inverting amplifier providing a signal to its output which is the logical inverse of the signal provided to its input, said input of said first amplifier being coupled to said second output, said first amplifier further including means for programming the gain of said first amplifier;
  a second amplifier having an input and an output;
  a summing means for summing a plurality of voltages, including a plurality of inputs, one of said plurality of inputs being coupled to said output of said first amplifier and another of said plurality of inputs being coupled to a bias voltage, said summing means further having an output coupled to said input of said second amplifier for providing a summed voltage to said second amplifier;
  first and second transistors each having a gate, source, and drain electrode, wherein said gate of said first transistor is coupled to said output of said second amplifier, said gate of said second transistor is coupled to said second input, said source of said second transistor is coupled to a supply voltage;
  a resistor having one end coupled to said drain of said second transistor, and having a second end coupled to said source of said first transistor, and one of said summing means inputs; and
  means, coupled to said resistor means and said drain of said second transistor, for providing an output signal to said fourth input.

13. The integrated circuit of claim 2 wherein said analog comparator includes
  a differential amplifier having a third input for receiving a third voltage, a fourth input for receiving a fourth voltage, a first output for providing a logic signal output, and a second output for providing the inverse of said logic signal output, wherein said differential amplifier outputs a first logic signal to said first output when the amplitude of said third voltage is less than the amplitude of said fourth voltage, and said differential amplifier outputs the inverse of said first logic signal to said first output when the amplitude of said third voltage is greater than the amplitude of said fourth voltage.

14. The integrated circuit of claim 13 wherein said analog comparator further includes
  means for coupling said analog comparator to off-chip circuitry; and
  programmable voltage shift circuitry provided off-chip for increasing or decreasing said third and fourth voltages responsive to said first and second outputs, respectively, said programmable voltage shift circuitry including feedback circuitry,
  wherein said means for coupling connects said programmable voltage shift circuitry between said first and second voltage inputs and said third and fourth voltage inputs, respectively, and said feedback circuitry to said first and second outputs.

15. The integrated circuit of claim 1 wherein said programmable logic circuit comprises
  a programmable combinatorial array having a plurality of array inputs and at least one array output and being programmable such that each of said array outputs creates an array output signal which is a desired digital function of a subset of said array inputs;
  means for coupling the signal on the output of said analog comparator to at least one of said plurality of array inputs; and
  means for coupling the signal on one of said array outputs to one of said logic circuit outputs.

16. The integrated circuit of claim 15 wherein said programmable combinatorial array includes an AND plane having a plurality of AND array inputs and AND array outputs.

17. The integrated circuit of claim 16 wherein said programmable combinatorial array further includes a fixed input OR plane having at least one OR output and at least one OR input, and means for providing said at least one OR output to said logic circuit output.

18. The integrated circuit of claim 17 further including means for receiving a clock signal and means for coupling said clock signal to one of said plurality of AND array inputs and said analog comparator.

19. The integrated circuit of claim 15 wherein said means for providing the signal on one of said plurality of array outputs to said at least one logic circuit output includes an output block comprising at least one D-type flip-flop having a data input, data output, and clock input, said data input being coupled to said at least one array output.

20. The integrated circuit of claim 19 wherein said output block further includes output logic coupled to said at least one array output and the data output of said D-type flip-flop.

21. The integrated circuit of claim 20 wherein said output buffer logic includes
means for coupling said output signal to a subset of said plurality of array inputs, and
an output buffer.

22. The integrated circuit of claim 19 wherein said D-type flip-flop further includes a inverting data output coupled to a subset of said plurality of array inputs.

23. The integrated circuit of claim 21 wherein said output buffer further includes means for enabling said output buffer responsive to a plurality of output enable signals, said output enable signals comprising a subset of said plurality of array outputs.

24. The integrated circuit of claim 15 wherein said programmable combinatorial array comprises a programmable AND plane having a plurality of AND array inputs and a plurality of AND array outputs, and an OR gate array containing a plurality of OR gates, each said OR gate having a plurality of inputs and outputs, said OR gate array including a plurality of sub-groups of OR gates, each of said plurality of sub-groups sharing one of a plurality of subsets of said AND array outputs as OR gate inputs.

25. The integrated circuit of claim 24 wherein each of said plurality of sub-groups includes two OR gates.

26. The integrated circuit of claim 25 wherein a first of said plurality of sub-groups shares a first subset of eight AND array outputs, a second of said plurality of sub-groups shares a second subset of ten AND array outputs, and a third of said plurality of subgroups shares a third subset of twelve AND array outputs.

27. The integrated circuit of claim 24 wherein said output block further includes an output buffer coupled to said OR gate array outputs and said logic circuit.

28. The integrated circuit of claim 27 wherein said output buffer includes means for selectively providing said OR gate array outputs to said output pin.

29. A single integrated circuit, comprising:
means for comparing a first and second analog input voltage and for providing a logic state signal to at least one output; and
a programmable logic device for providing an output signal including a programmable AND array having a plurality AND array inputs and AND array outputs, a fixed OR array having a plurality of inputs selectively coupled to said plurality of AND array outputs, and an output block for providing an output signal, said fixed OR array having a plurality of OR array outputs coupled to said output block, wherein said at least one output of said means for comparing is coupled to at least one of said plurality of AND array inputs.

30. The integrated circuit of claim 29 wherein said means for comparing includes
a test voltage input and reference voltage input;
a differential amplifier having an inverting input, a non-inverting input, a non-inverting output for providing said logic state signal output, and an inverting output for providing the inverse of said logic state signal output, and
programmable voltage shift circuitry coupled between said reference voltage input and said inverting input, and said test voltage input and non-inverting input, said programmable voltage shift circuitry including feedback circuitry, coupled to said non-inverting and inverting outputs, for increasing or decreasing the voltage applied to said non-inverting input responsive to said non-inverting output and for increasing or decreasing the voltage applied to said inverting input responsive to said inverting output.

31. The integrated circuit of claim 30 wherein said differential amplifier outputs said logic state signal to said non-inverting output when said reference input voltage is greater-than or equal-to said test input voltage plus a first offset voltage, and said differential amplifier outputs the inverse of said logic state signal to said non-inverting output when said reference input voltage is less than or equal to said test input voltage minus a second offset voltage.

32. The integrated circuit of claim 30 wherein said programmable voltage shift circuitry provides said non-inverting and inverting input voltages at amplitudes which are proportionately greater than the amplitudes of said test and reference voltages, respectively.

33. The integrated circuit of claim 30 wherein said programmable voltage shift circuitry provides said non-inverting and inverting input voltages at amplitudes which are proportionately less than the amplitudes of said test and reference voltages, respectively.

34. The integrated circuit of claim 30 further including a multiplexer coupled to said reference voltage input for selectively coupling said reference voltage to a one of said plurality of AND array inputs or said inverting input.

35. The integrated circuit of claim 34 wherein said test voltage input comprises a Schmitt-trigger input to said programmable logic device.

36. The integrated circuit of claim 29 wherein said means for comparing further includes means for receiving a clock signal, said clock signal for locking the output state of said comparator at said logic state signal or the inverse of said logic state signal.

37. The integrated circuit of claim 36 further including means for coupling said clock signal to a third one of said plurality of AND array inputs.

38. The integrated circuit of claim 29 wherein output block comprises at least one D-type flip-flop having a data input, data output and clock input.

39. The integrated circuit of claim 38 wherein said output block further includes output logic coupled to said at least one array output and the data output of said at least one D-type flip-flop.

40. The integrated circuit of claim 39 wherein said output logic includes an output buffer and means for coupling said output signal to a first subset of said plurality of AND array inputs.

41. The integrated circuit of claim 40 wherein said output buffer further includes means for enabling said output buffer responsive to a plurality of output enable signals, said output enable signals comprising a first subset of said plurality of AND array outputs.

42. The integrated circuit of claim 41 wherein said D-type flip-flop further includes a inverting data output coupled to a second subset of said plurality of array inputs.

43. The integrated circuit of claim 29 wherein said OR array further includes a plurality of subgroups of OR gates, each of said OR gates having a plurality of inputs and at least one output, each of said plurality of sub-groups sharing a second subset of said AND array outputs as OR gate inputs.

44. The integrated circuit of claim 43 wherein each of said plurality of sub-groups includes two OR gates.

45. The integrated circuit of claim 44 wherein a first of said plurality of sub-groups shares a third subset of eight AND array outputs, a second of said plurality of sub-groups shares a fourth subset of ten AND array outputs, and a third of said plurality of subgroups shares a fifth subset of twelve AND array outputs.

46. The integrated circuit of claim 43 wherein said output block further includes an output buffer coupled to said OR plane outputs and said logic circuit.

47. The integrated circuit of claim 46 wherein said output buffer includes means for selectively providing said OR plane outputs to said output pin.

48. A single integrated circuit, comprising:
means for comparing the relative amplitudes of two analog variable inputs and providing a logic signal output to an output means wherein said logic signal output is reflective of which of said two analog variable inputs is greater in amplitude at a given time;
a programmable array logic (PAL) device having a plurality of array inputs and array outputs; and
means for coupling said output means to one of said plurality of array inputs.

49. The integrated circuit of claim 48 wherein said means for comparing comprises
first and second voltage inputs;
a differential amplifier having an inverting input coupled to said first voltage input, a non-inverting input coupled to said second voltage input, a non-inverting output for providing a logic signal output, and an inverting output for providing the inverse of said logic signal output;
programmable voltage shift circuitry coupled between said first voltage input and said inverting input and said second voltage input and non-inverting input, respectively, and including feedback circuitry coupled to said non-inverting and inverting outputs, for increasing or decreasing the voltage applied to said non-inverting input responsive to said non-inverting output and for increasing or decreasing the voltage applied to said inverting input responsive to said inverting outputs.

50. The integrated circuit of claim 48 wherein said PAL comprises a programmable AND plane having a plurality of AND array inputs and a plurality of AND array outputs, and a fixed input OR array, said OR array including a plurality of groups of OR gates, each OR gate having a plurality of inputs and at least one output, each of said plurality of groups sharing one of a plurality of subsets of said AND array outputs as OR gate inputs, and an output block coupled to said OR gate outputs for coupling at least one output signal to a PAL output.

51. The integrated circuit of claim 50 wherein each of said plurality of groups includes two OR gates.

52. The integrated circuit of claim 51 wherein a first of said plurality of groups shares a first subset of eight AND array outputs, a second of said plurality of groups shares a second subset of ten AND array outputs, and a third of said plurality of groups shares a third subset of twelve AND array outputs.

53. The integrated circuit of claim 50 wherein said output block further includes output logic coupled to said OR array outputs and said logic circuit, said output logic having a plurality of multiplexers for selectively providing said OR array outputs to said output pin or a subset of said plurality of AND many inputs.

54. The integrated circuit of claim 53 wherein said output buffer further includes means for coupling said at least one output signal to a subset of said plurality of AND array inputs.

55. A single integrated circuit, comprising
a plurality of analog comparators, each said comparator having an output; and
a programmable logic device comprising a programmable AND array having a plurality of inputs, a first subset of said plurality of inputs being coupled to said comparator outputs, said programmable AND array further including a plurality of outputs, said programmable logic device further including a fixed OR array having a plurality of inputs coupled to said plurality of outputs of said AND array, and an output logic block for coupling said outputs of said fixed OR array to an output element.

56. In a programmable array logic device on a single integrated circuit chip including a programmable AND array, a fixed OR array, and an output block, an input element for providing signals to said programmable AND array, comprising:
first and second input means for receiving first and second input voltages;
at least one output means;
means coupled to said first and second input means for providing an output signal to said output means responsive to said first and second input voltages, said output signal being a first state when the amplitude of said first input voltage equals the amplitude said second input voltage plus a predetermined voltage, and a second state when the amplitude of said first input voltage equals the amplitude of said second input voltage minus said predetermined voltage.

* * * * *

UNITED STATES PATENT AND TRADEMARK OFFICE
CERTIFICATE OF CORRECTION

PATENT NO. : 5,153,462

DATED : Oct. 6, 1992

INVENTOR(S) : Om P. Agrawal, Michael J. Wright, Steve Sidman

It is certified that error appears in the above-identified patent and that said Letters Patent is hereby corrected as shown below:

Col. 2, line 26: after "FIG." and before "is" insert --1--

Col. 3, line 47: after "FIG." and before "depicts" insert --1--

Col. 5, line 24: after "Fig. 1" delete --,--

Col. 5, line 25: delete "are" and insert therefore --having data inputs--

Col. 5, line 25: delete "include" and insert therefore --including--

Col. 5, line 62: after "35" delete --25--

Col. 6, line 39: delete "logic" and insert therefore --level--

Col. 7, line 6: delete "output 27" and insert therefore --outputs 36, 37--

Col. 7, line 27: after "Vd(-)" and before "a" insert therefore --by--

UNITED STATES PATENT AND TRADEMARK OFFICE
CERTIFICATE OF CORRECTION

PATENT NO. : 5,153,462
DATED : Oct. 6, 1992
INVENTOR(S) : Om P. Agrawal, et al.

It is certified that error appears in the above-identified patent and that said Letters Patent is hereby corrected as shown below:

Col. 7, line 57: delete "3 and 4" and insert therefore --3A, 3B, 4A, and 4B--

Col. 7, line 57: delete "Fig. 3" and insert therefore --Figs. 3A and 3B--

Col. 7, line 65: delete "4" and insert therefore --4A--

Col. 8, line 66: delete "31" and insert therefore --23--

Col. 8, line 67: delete "32" and insert therefore --25--

Col. 9, line 14: delete "gate" and insert therefore --base--

Col. 9, line 23: delete "is"

Col. 9, line 24: insert a paragraph break after "44."

Col. 9, line 28: delete "Q2" and insert therefore --Q1--

Col. 9, line 29: delete "Q2" and insert therefore --Q1--

UNITED STATES PATENT AND TRADEMARK OFFICE
CERTIFICATE OF CORRECTION

PATENT NO. : 5,153,462
DATED : Oct. 6, 1992
INVENTOR(S) : Om P. Agrawal, et al.

It is certified that error appears in the above-identified patent and that said Letters Patent is hereby corrected as shown below:

Col. 9, line 33: delete "Q2" and insert therefore --Q1--

Col. 10, line 10: after "specification" and before "For" insert --.--

<u>In the Specification</u>

Col. 2, line 13, after --aspect-- before --the-- insert "of"

Signed and Sealed this

Twenty-eighth Day of December, 1993

Attest:

BRUCE LEHMAN

Attesting Officer Commissioner of Patents and Trademarks